United States Patent [19]

Hoshi

[11] Patent Number: 6,038,180
[45] Date of Patent: Mar. 14, 2000

[54] SEMICONDUCTOR MEMORY CAPABLE OF DETECTING MEMORY CELLS WITH SMALL MARGINS AS WELL AS SENSE AMPLIFIER

[75] Inventor: Katsuji Hoshi, Tokyo, Japan

[73] Assignee: NEC Corporation, Tokyo, Japan

[21] Appl. No.: 09/120,302

[22] Filed: Jul. 22, 1998

[30] Foreign Application Priority Data

Jul. 23, 1997 [JP] Japan .................................... 9-197084

[51] Int. Cl.[7] ................................................. G11C 13/00
[52] U.S. Cl. ........................................... 365/201; 365/226
[58] Field of Search ......................... 365/189.01, 230.01, 365/201, 226

[56] References Cited

U.S. PATENT DOCUMENTS 5,267,218  11/1993  Elbert ...................................... 365/226

FOREIGN PATENT DOCUMENTS 3-209688   9/1991   Japan .

*Primary Examiner*—Terrell W. Fears
*Attorney, Agent, or Firm*—Sughrue, Mion, Zinn, Macpeak & Seas, PLLC

[57] ABSTRACT

A semiconductor memory comprises: at least two word lines; at least two bit lines which are arranged in a manner crossing the word lines; a reference potential generating circuit for generating a predetermined reference potential; reference potential transfering circuits for transfering the reference potential to the bit lines; at least two memory cells arranged at intersections of the word lines and the bit lines; a sense amplifier for amplifying potential difference between the bit lines; a test mode determination circuit for detecting signal information for starting a predetermined test; and a sense time control circuit taking an output signal from the test mode determination circuit as its input so as to control an operation delay time of the sense amplifier and the word lines. According to the test mode under the present structure, conditions for read-out are more strict, and thus memory cells with small margins, with a small storage capacity, or with a little storage voltage, and a sense amplifier with a low amplification sensibility with respect to the difference potential between the bit lines can be easily detected.

11 Claims, 6 Drawing Sheets

SEMICONDUCTOR MEMORY CAPABLE OF DETECTING MEMORY CELLS WITH SMALL MARGINS AS WELL AS SENSE AMPLIFIER

BACKGROUND OF THE INVENTION

The present invention relates to a semiconductor memory, particularly to that which is capable of detecting memory cells which are short of operation margins of data storage, and a sense amplifier.

DESCRIPTION OF THE RELATED ART

In recent years, microscopic processing technology is progressing year by year finding its application on semiconductor memories, causing the semiconductor memory to become high-integrated resulting in further causing the semiconductor memory to carry larger capacity. In general, a memory information quantity Qs of a memory cell is expressed by (memory cell storage capacity)×(memory cell storage voltage), i.e. Qs=Cs×Vcell.

FIG. 1 is a circuit diagram showing a structure of a first prior art example of the semiconductor memory. The semiconductor memory of this prior art example comprises a memory cell array, a sense amplifier, and a precharge section. A reference numeral 10 refers to the sense amplifier. The memory cell comprises an N-channel enhancement MOS transistor TN1 (14), which will also be referred to as an N-channel transistor, and a capacitor C1 (13). The precharge circuit comprises N-channel transistors TN2~TN4. Further, as to bit lines BLnA (11) and BLnB (12), there are a plurality of memory cells connected respectively thereto. To the gates of the N-channel transistors of a plurality of memory cells, word lines i.e. signals øWLm (m=1~m) are connected in a manner crossing the bit lines.

FIG. 2 is a diagram showing a timing chart for explaining a circuit operation of the semiconductor memory of the first prior art example shown in FIG. 1. During period A in FIG. 2, a precharge signal øP (19) is a voltage with a level high enough to exceed a threshold voltage (VT) of the N-channel transistor. The bit lines BLnA (11) and BLnB (12) are therefore maintained at a potential of a reference potential, i.e. Vref, due to the N-channel transistors TN2~TN4 which takes the precharge signal øP (19) as their gate input. In this occasion, a potential quantity of the reference potential Vref is assumed as being somewhere between a power-supply voltage (Vcc) and a ground potential (GND). Then the high-level precharge signal øP becomes a low-level potential which is below VT of the N-channel transistor.

During period B in FIG. 2, a signal øWL1 (22) which selects the memory cell turns from low level to high level, the N-channel transistor TN1 which takes the signal øWL1 as its gate input is activated, and a high-level charge which is stored in the capacitor C1 (13) is outputted to the bit line BLnA (11). Assuming that the capacitor C1 (13) is charged with a high-level potential under the above circumstances just described, the operation on a bit line BLnA side will be that a potential rise of ΔV with respect to the reference potential Vref occurs at the bit line BLnA, as shown in FIG. 2.

During period C in FIG. 2, since a signal øSE which activates the sense amplifier 10 turns to a high level from a low level, and the sense amplifier 10 lets a difference potential between the bit line BLnA and BLnB go through a comparative amplification, the bit line BLnA is potential-amplified to Vcc and the bit line BLnB is potential-amplified to GND.

A semiconductor memory disclosed in Japanese Patent Laid-Open Publication No. 3-209688, which is regarded here as a second prior art example, also proposes a method in which a potential difference between bit lines are lowered at a read-out operation, and memory cells with small operation margins of data storage are detected, so as to shorten a testing time. The second prior art example, however, is of a type in which a gate potential of an N-type field-effect transistor 3 which is charged to the bit line on one of the bit lines is set to (VBL+β), so as to generate a potential difference between the set of bit lines during a precharge period.

With respect to the semiconductor memory of the first prior art example constructed in the above-described manner, the testing period tends to become longer as the memory cells become larger in their capacities. Especially, as the microscopic processing has further progressed, influences by parasitic elements, occurring within the memory cell array, such as a parasitic resistance, a parasitic capacitance, a parasitic transistor etc., on the operation of the memory cell array are magnified. This indicates that tests should be conducted with respect to all sorts of memory cell patterns and operation timing. Accordingly, it is also noted as a significant issue that the testing time should become longer.

With respect to the semiconductor memory of the second prior art example, since VT of the N-type field-effect transistor 3 should vary, potential differences among a plurality of bit lines are varied, too. Consequently, it is impossible to stabilize the initial potential difference, by which it is difficult to detect only the memory cells having small margins among the other memory cells. Further, for the gate potential of the N-type field-effect transistor 3 is (VBL+β) when the bit line BLn is of a high level, it takes a long time for a potential of the bit line BLn to be lowered. Thus, it is difficult to provide a stabilized difference potential between bit lines.

SUMMARY OF THE INVENTION

It is therefore an object of the present invention to provide a semiconductor memory which is capable of easily detecting memory cells with small margins, i.e. memory cells with less storage capacity or storage voltage, and a sense amplifier with a low amplification sensitivity with respect to a difference potential between a set of bit lines, so as to shorten a testing time.

According to a first aspect of the invention, there is provided a semiconductor memory capable of detecting the presence of memory cells having small operation margins of data storage, within a short period of time, comprising: at least two word lines; at least two bit lines which are arranged in a manner crossing the word lines; a reference potential generating circuit for generating a predetermined reference potential; a reference potential transfering means for transfering the reference potential to the bit lines; at least two memory cells arranged at intersections of the word lines and the bit lines; a sense amplifier connected to the bit lines and amplifying potential difference between the bit lines, one of the bit lines receiving information of the memory cells, and the other one of the bit lines receiving the reference potential; a test mode determination circuit for detecting signal information for starting a predetermined test; and a sense time control circuit taking an output signal from the test mode determination circuit as its input so as to control an operation delay time of the sense amplifier and the word lines.

According to a second aspect of the invention there is provided a semiconductor memory according to the first aspect, wherein; a set of bit lines connected to the sense amplifier of the semiconductor memory indicates at least tow bit lines.

According to a third aspect of the invention, there is provided a semiconductor memory according to the first aspect, wherein; the signal information for starting the test is a signal for starting a test for detecting the presence of memory cells having small operation margins which are inputted from the outside of the semiconductor memory.

According to a fourth aspect of the invention, there is provided a semiconductor memory capable of detecting the presence of memory cells having small operation margins of data storage, within a short period of time, comprising: at least two word lines; at least two bit lines which are arranged in a manner crossing the word lines; a reference potential generating circuit for generating a predetermined reference potential; a reference potential transfering means for transfering the reference potential to the bit lines; at least two memory cells arranged at intersections of the word lines and the bit lines; a sense amplifier connected to the bit lines and amplifying potential difference between the bit lines, one of the bit lines receiving information of the memory cells, and the other one of the bit lines receiving the reference potential; a test mode determination circuit for detecting signal information for starting a predetermined test; and a reference potential transforming means taking an output signal from the test mode determination circuit as its input so as to transform the reference voltage of the bit lines.

According to a fifth aspect of the invention, there is provided a semiconductor memory according to the fourth aspect, wherein; a set of bit lines connected to the sense amplifier of the semiconductor memory includes at least tow bit lines.

According to a sixth aspect of the invention, there is provide a semiconductor memory according to the fourth aspect, wherein; the signal information for starting the test is a signal for starting a test for detecting the presence of memory cells having small operation margins which are inputted from the outside of the semiconductor memory.

According to a seventh aspect of the invention, there is provided a semiconductor memory according to the fourth aspect of the invention, wherein; the reference potential transforming means includes a transformation signal generating means for transforming the reference voltage of the bit lines, the transformation signal generating means inputting the output signal from the test mode determination circuit for starting the test, and transforming the reference potential of the bit lines after an activation of a word line selecting signal.

BRIEF DESCRIPTION OF THE DRAWINGS

The above and further objects and the novel feature of the invention will more fully appear from the following detailed description when the same is read in connection with the accompanying drawings, in which.

DESCRIPTION OF THE PREFERRED EMBODIMENTS

Figure 1:
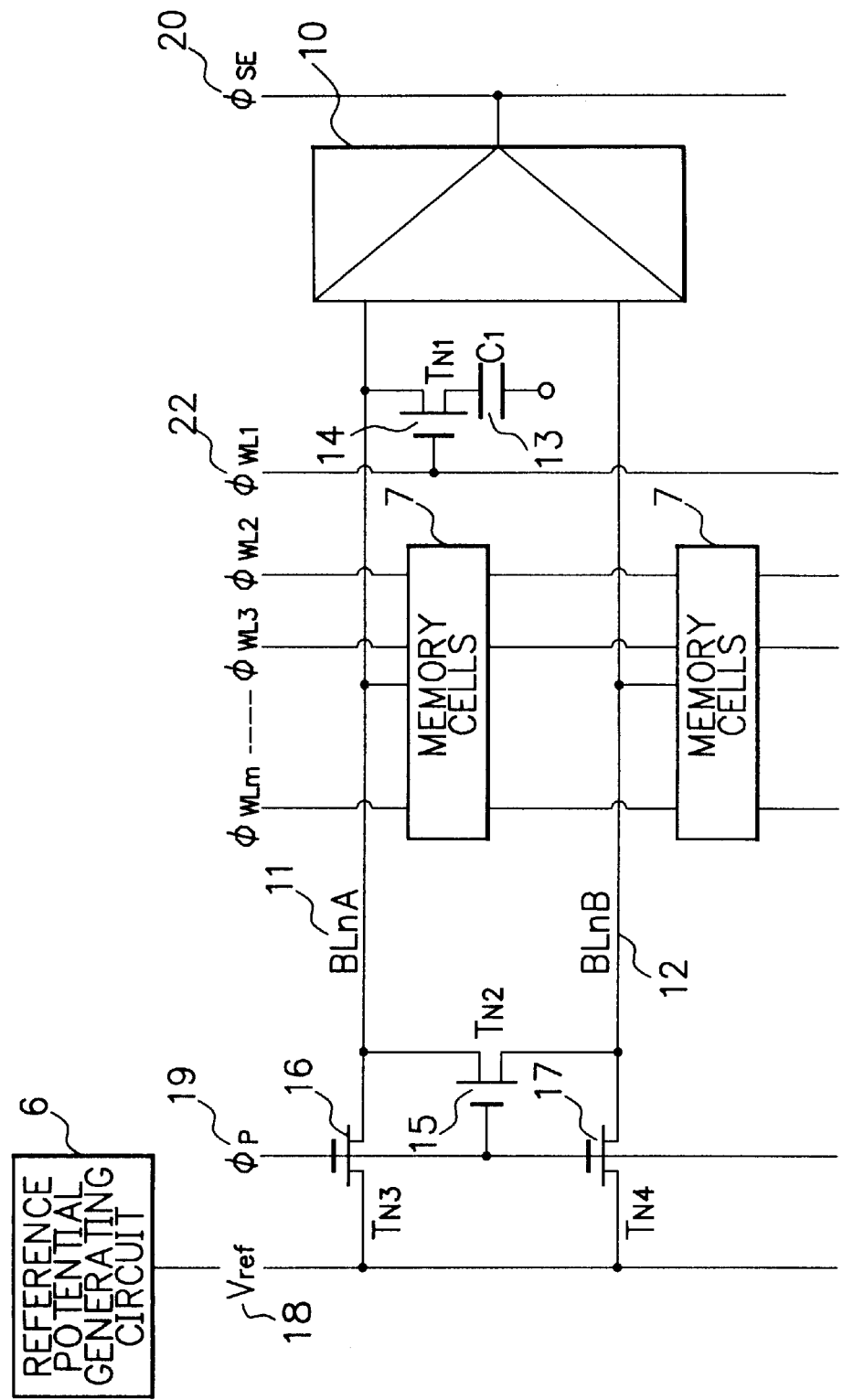
FIG. 1 is a circuit diagram showing a structure of a conventional semiconductor memory.

Referring now to the drawings, a description of preferred embodiments of the present invention will be given in detail.

Figure 3:
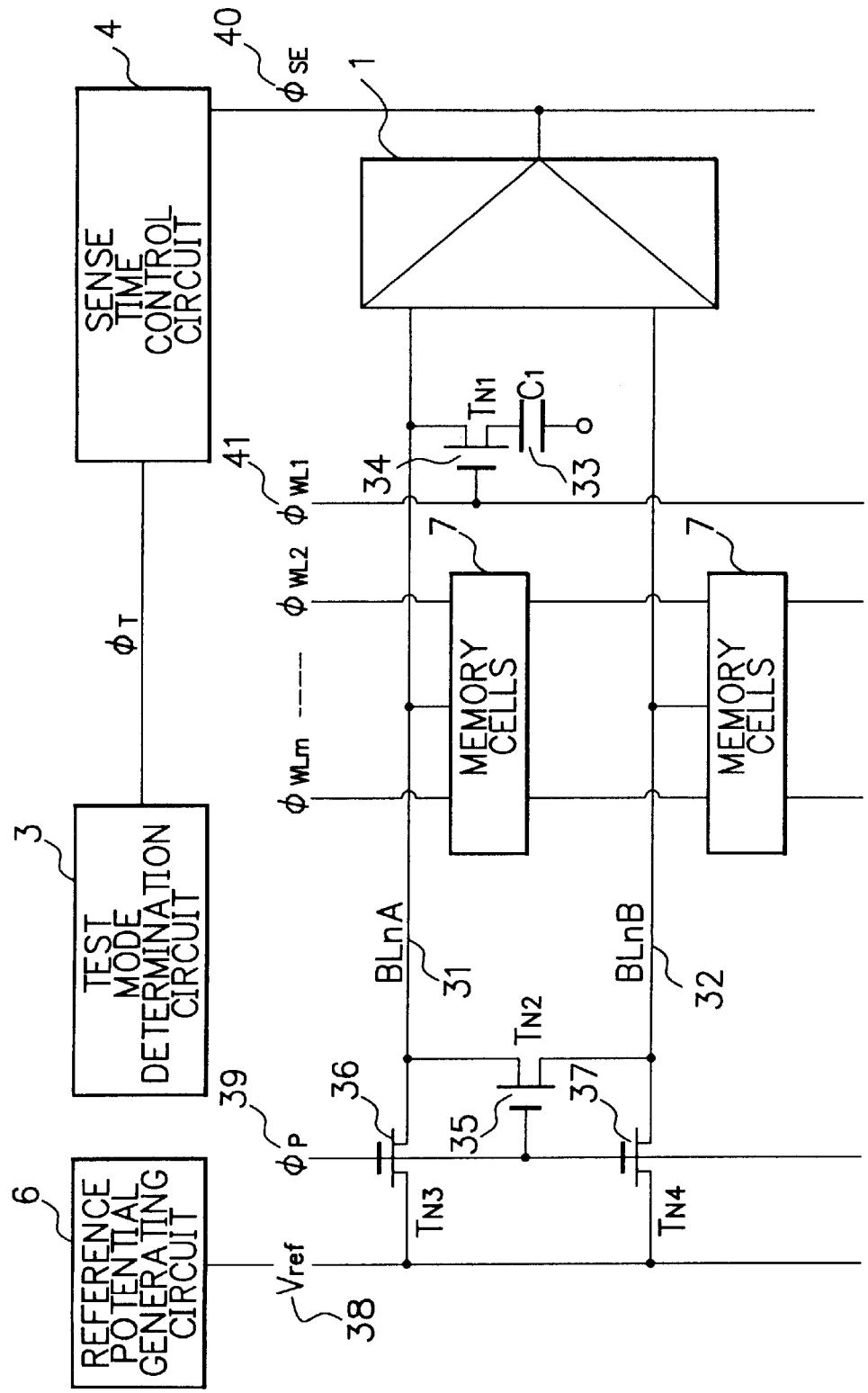
FIG. 3 is a block diagram showing an example of a circuit structure of a precharge section of the semiconductor memory according to a first embodiment.
Figure 4:
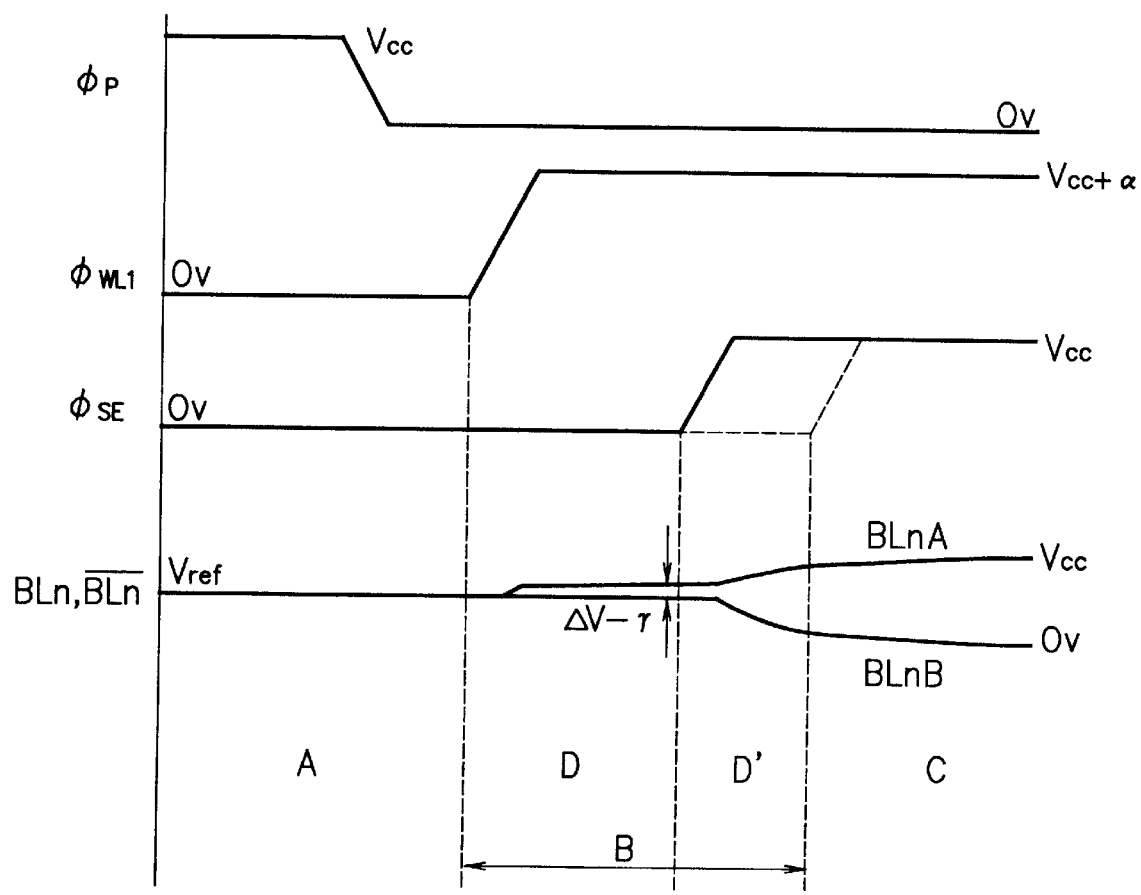
FIG. 4 is a timing chart showing an example of an operation of the semiconductor memory according to the first embodiment.
Figure 5:
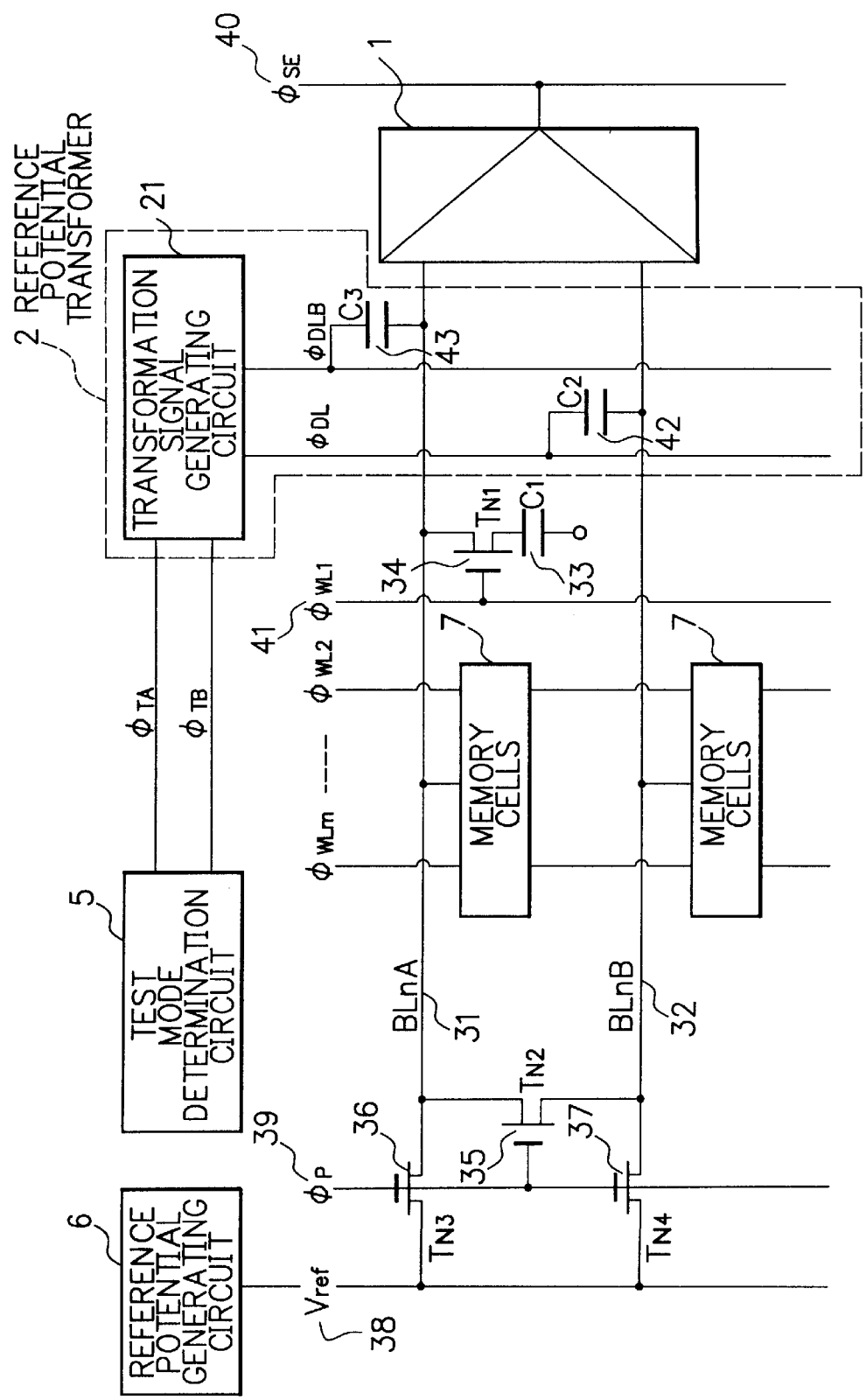
FIG. 5 is a block diagram showing an example of a circuit structure of a precharge section of the semiconductor memory according to a second embodiment.
Figure 6:
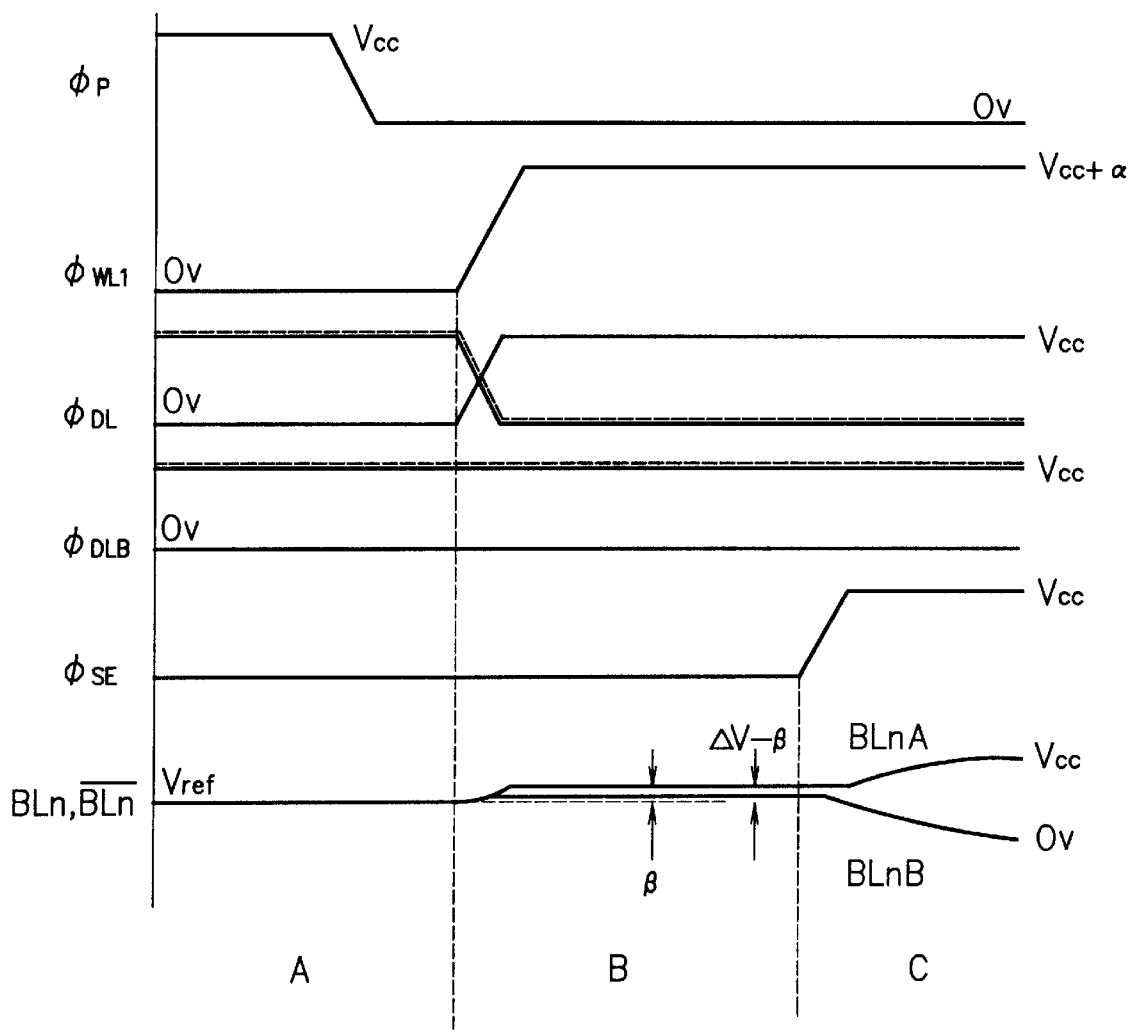
FIG. 6 is a timing chart showing an example of an operation of the semiconductor memory according to the second embodiment.

With reference to FIGS. 3 to 6, two embodiments of the semiconductor memory of the present invention will be described. FIGS. 3 and 4 show a first embodiment of the present invention, while FIGS. 5 and 6 show a second embodiment. FIGS. 3 and 5 are block diagrams showing examples of a circuit structure of the semiconductor memory according to the two embodiments respectively. FIGS. 4 and 6 are timing charts showing examples of an operation of the semiconductor memory according to the first and the second embodiments respectively.

In FIG. 3, a sense amplifier 1 is connected to a set of bit lines BLnA (n=1~n) and BLnB (n=1~n). A memory cell 7 comprises an N-channel transistor TN1 (34) and a capacitor C1 (33). To the gate of an N-channel transistor TN1 (34) of the memory cell 7, a word line, i.e. a signal øWL1 (41) is connected. To the bit lines BLnA (31) and BLnB (32), a plurality of memory cells 7 are connected respectively thereto. To the gates of the N-channel transistors of those memory cells, word lines, i.e. signals øWLm (m is a natural number equal to or larger than 2) are connected in a manner crossing the bit lines.

A reference transfering means serving to transfer a reference potential, which is also referred to as a precharge circuit, comprises a reference potential generating circuit 6 and N-channel transistors TN2~TN4. To each of the gates of the N-channel transistors TN2~TN4 constructing the precharge circuit, a precharge signal øP (39) is connected. The N-channel transistor TN2 (35) is connected in between the bit lines BlnA (31) and BLnB (32). The N-channel transistor TN3 is connected in between the bit line BlnA (31) and a reference voltage Vref (38). The N-channel transistor TN4 (37) is connected in between the bit line BlnB (32) and the reference voltage Vref (38). The sense amplifier 1 is connected to a sense time control circuit 4 by a signal øSSE (40). The sense time control circuit 4 is connected to a test mode determination circuit 3 by øT.

Now a circuit operation of the semiconductor memory shown in FIG. 3 will be described. The semiconductor memory of the first embodiment has two kinds of modes represented by an ordinary operation mode and a test operation mode. The ordinary operation mode and the test operation mode are distinguished by having signal information inputted from outside the semiconductor memory so as to have the test mode determination circuit 3 output a discrimination signal øT.

In the following, the ordinary operation mode will be described. The basic operation under the ordinary operation mode is substantially the same as the operation of the prior art example shown in FIG. 2. That is, when the test mode determination circuit 3 passes to the signal øT a piece of information indicating the ordinary operation mode, the sense time control circuit 4 is to set a time for the signal øSE, which activates the sense amplifier 1, to activate after a lapse of period B from a word line activation. A time chart for showing a circuit operation of the semiconductor memory under the above conditions is the same as the one described with reference to FIG. 2, showing the first prior art example.

Figure 2:
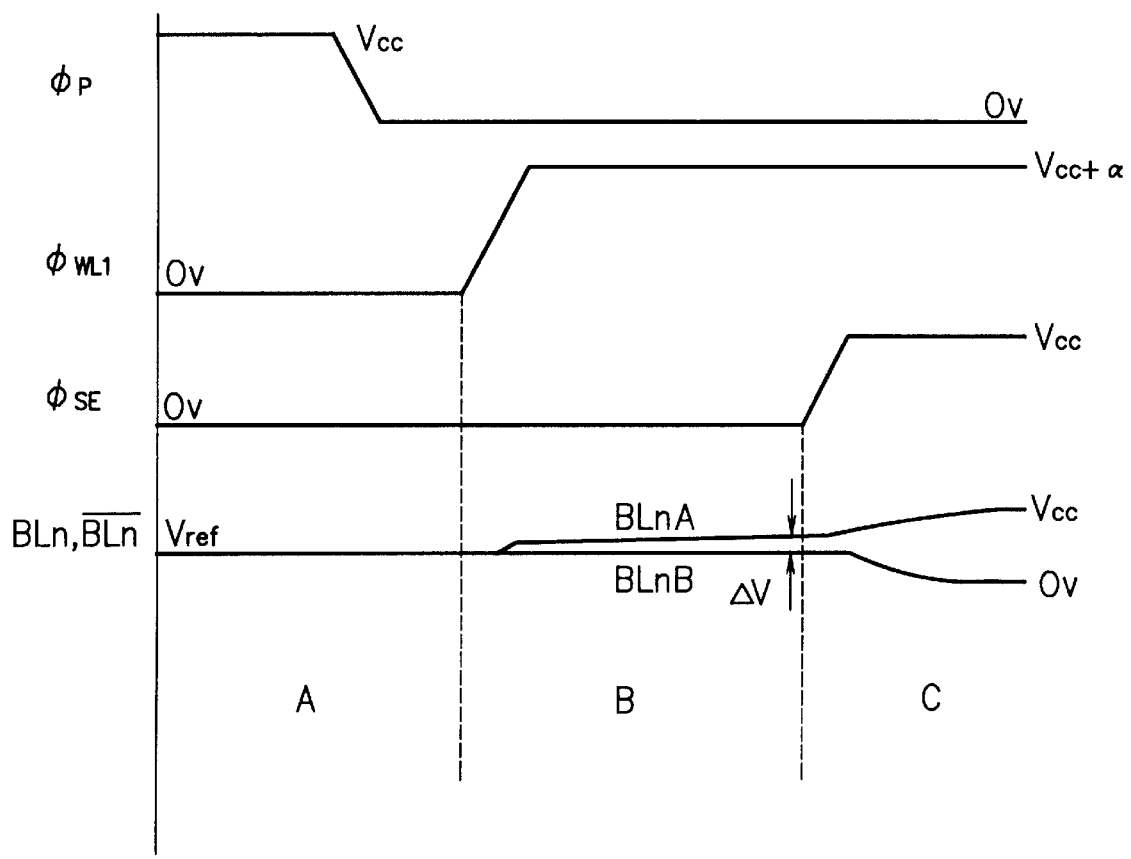
FIG. 2 is a timing chart showing an example of a fundamental operation of the conventional semiconductor memory under a normal operation mode.

During period A in FIG. 2, a precharge signal øP is of a high level, so that the bit lines BLnA and BLnB are held at a potential of a reference potential Vref, due to the N-channel transistors TN2~TN4 which take the precharge signal øP as their gate input. In this occasion, a potential of the reference potential Vref is assumed as being somewhere between Vcc and GND. After this, the high-level precharge signal øP becomes low-level.

During period B in FIG. 2, a signal øWL1 which selects the memory cell turns from low level to high level, the N-channel transistor TN1 (34) which takes the signal øWL1 as its gate input is activated, and a charge which is stored in the capacitor C1 (33) is outputted to the bit line BLnA (31). Assuming that the capacitor is charged with a high-level potential under the above conditions, the operation on a bit line BLnA side will be that a potential rise of $\Delta V$ with respect to the reference potential Vref occurs at the bit line BLnA, as shown in FIG. 2.

During period C in FIG. 2, since a signal øSE which activates the sense amplifier 1 turns to high level from low level, and the sense amplifier lets a difference potential of the bit line BLnA and BLnB go through a comparative amplification, the bit line BLnA is potential-amplified to Vcc and the bit line BLnB is potential-amplified to GND.

In the following, the test operation mode will be described. When the test mode determination circuit 3 passes to the signal øT a piece of information indicating the test operation mode, the sense time control circuit 4 is to set a time for the signal øSE, which activates the sense amplifier 1, to activate after a lapse of period D from a word line activation. The time chart for showing a circuit operation of the semiconductor memory under the above conditions is shown in FIG. 4.

During period A in FIG. 4, a precharge signal øP (39) is of a high level, so that the bit lines BLnA and BLnB are held at a potential of a reference potential Vref, due to the N-channel transistors TN2~TN4 which take the precharge signal øP as their gate input. In this occasion, a potential quantity of the reference potential Vref is assumed as being somewhere between Vcc and GND. After this, the high-level precharge signal øP becomes low-level.

During period D in FIG. 4, a signal øWL1 (41) which selects the memory cell 7 turns from low level to high level, the N-channel transistor TN1 which takes the signal øWL1 as its gate input is activated, and a charge which is stored in the capacitor C1 (33) is outputted to the bit line BLnA. Assuming that the capacitor C1 is charged with a high-level potential under the above conditions, the operation on a bit line BLnA side will be that a potential rise of $(\Delta V-\gamma)$ with respect to the reference potential Vref occurs on the bit line BLnA, as shown in FIG. 4.

During period D' and C in FIG. 4, a signal øSE which activates the sense amplifier 1 turns to high level from low level, and the sense amplifier 1 lets a difference potential $(\Delta V-\gamma)$ of the bit line BLnA and BLnB go through a comparative amplification. In this occasion, since the signal øSE's time of activation is ahead of the normal operation mode by a period D', a signal potential which is outputted from the memory cell 7 is decreased by $\gamma$, when the sense amplifier starts its amplification. Then, when the potential difference $(\Delta V-\gamma)$ is more than the smallest potential difference that the sense amplifier 1 is capable of detecting, the bit line BLnA is potential-amplified to Vcc while the bit line BLnB is amplified to GND.

In case when stored information of the memory cell 7 with a small margin is read out during period D' and C, the signal potential to be outputted to the bit lines will become smaller, and the potential difference becomes even smaller than the smallest potential difference which the sense amplifier can detect, while a wrong amplification operation is conducted and the bit line BLnA becomes GND and the bit line BLnB becomes Vcc.

In this manner, according to the present embodiment, conditions for read-out are more strict, which provides an advantage that memory cells with small margins and a sense amplifier can be easily detected.

FIG. 5 is a circuit diagram showing the semiconductor memory of a second embodiment of the invention. In FIG. 5, a sense amplifier 1 is connected to a set of bit lines BLnA (n=1~n) and BLnB (n=1~n). A memory cell 7 comprises an N-channel transistor TN1 (34) and a capacitor C1 (33). To the gate of an N-channel transistor TN1 (34) of the memory cell 7, a word line, i.e. a signal øWL1 (41) is connected. To the bit lines BLnA and BLnB, a plurality of memory cells 7 are connected respectively thereto. To the gates of the N-channel transistors of those memory cells, word lines, i.e. signals øWLm (m=2~m) are connected in a manner crossing the bit lines.

A precharge circuit, comprises N-channel transistors TN2~TN4. To each of the gates of the N-channel transistors TN2~TN4, a precharge signal øP (39) is connected. The N-channel transistor TN2 (35) is connected in between the bit lines BlnA (31) and BLnB (32). The N-channel transistor TN3 (36) is connected in between the bit line BlnA (31) and a reference voltage Vref. The N-channel transistor TN4 is connected in between the bit line BlnB and the reference voltage Vref.

A reference potential transformer 2 comprises a transformation signal generating circuit 21, signals øDL and øDLB, and capacitors C2 (42) and C3 (43). The signals øDL and øDLB are connected to the transformation signal generating circuit 21. One end of the capacitor C2 (42) is connected to the signal øDL, while the other end is connected to the bit line BLnB. One end of the capacitor C3 is connected to the signal øDLB, while the other end is connected to the bit line BLnA. The transformation signal generating means 21 is connected to the test mode determination circuit 5 via signals øTA and øTB.

Next, a circuit operation of the second embodiment of the invention will be shown in FIG. 5 described with reference to FIGS. 6 and 2. When the test mode determination circuit 5 passes pieces of information indicating the normal operation mode to the signals øTA and øTB, the transformation signal generating circuit 21 will not operate, and the signals øDL and øDLB are maintained as predetermined potentials. The time chart showing a circuit operation of the semiconductor memory under the above conditions is shown in FIG. 2.

The operation under the normal operation mode in this embodiment is the same as that of the case shown in FIG. 3. Therefore, repeated explanation will be omitted.

In the following, the test operation mode in this embodiment will be described. When the test mode determination circuit 5 passes to the signals øTA and øTB pieces of information indicating the test operation mode, transformation signal generating circuit 21 becomes operable, and the signals øDL and øDLB are set to low level. The time chart for showing a circuit operation of the semiconductor memory under the above conditions is shown in FIG. 6.

During period A in FIG. 6, a precharge signal øP is of a high level, so that the bit lines BLnA and BLnB are held at a potential of a reference potential Vref, due to the N-channel transistors TN2~TN4 which takes the precharge signal øP as their gate input. In this occasion, a potential of the reference potential Vref is assumed as being somewhere between Vcc and GND. After this, the high-level precharge signal øP becomes low-level.

During period B in FIG. 6, a signal øWL1 and øDL which selects the memory cell 7 turns from low level to high level, the N-channel transistor TN1 which takes the signal øWL1 as its gate input is activated, a charge which is stored in the capacitor C1 is outputted to the bit line BLnA, and the bit line BLnB will have a reference potential transformed to a potential which is higher than the reference potential Vref by a β worth of potential, i.e. (Vref+β), due to the capacitor C2 connected to one end of the bit line BLnB. Assuming that the capacitor C1 is charged with a high-level potential under the above conditions, the operation on a bit line BLnA side will be that a potential (Vref+ΔV) which is ΔV higher than the reference potential Vref is generated on the bit line BLnA, as shown in FIG. 6. In this occasion, the potential difference between the bit lines are as follows: (Vref+ΔV)−(Vref+β)= (ΔV−β).

During period C in FIG. 6, a signal øSE (40) which activates the sense amplifier 1 turns to high level from low level, and the sense amplifier 1 lets a difference potential (ΔV−β) of the bit lines BLnA and BLnB go through a comparative amplification. When the potential difference (ΔV−β) is more than the smallest potential difference that the sense amplifier I can detect, the bit line BLnA is amplified to Vcc while the bit line BLnB is amplified to GND by the sense amplifier 1. In case when stored information of the memory cell 7 with a small margin is read out during period C, the signal potential to be outputted to the bit lines will become smaller, and the potential difference becomes even smaller than the smallest potential difference which the sense amplifier can detect, while a wrong amplification operation is conducted and the bit line BLnA becomes GND and the bit line BLnB becomes Vcc.

Furthermore, according to the second embodiment, it is also possible to minimize the potential difference between bit lines, at a low-level outputting of the memory cell, by changing the polarities of the output signals øDL and øDLB to a waveform as indicated by dotted lines in FIG. 6, by the output from the test mode determination circuit 3.

In this manner, according to the second embodiment, conditions for read-out are more strict, which provides an advantage that memory cells with small margins and a sense amplifier can be easily detected.

According to the above embodiments, the semiconductor memory is capable of minimizing the difference potential between the bit lines, which are connected to the sense amplifier, by quickening the activating period of the sense amplifier. Also, the semiconductor memory is capable of detecting memory cells with small margins and a sense amplifier, by approaching toward the smallest potential difference that can be amplified.

According to the above embodiments, the semiconductor memory is capable of minimizing the difference potential between the bit lines, which are connected to the sense amplifier, by applying transformation of reference potential to one of the two bit lines connected to the sense amplifier.

Also, the semiconductor memory is capable of detecting memory cells with small margins and a sense amplifier, by approaching toward the smallest potential difference that can be amplified.

Although preferred embodiments of the invention have been described using specific terms, such description is not intended as limitation to the invention. It is therefore possible to make changes as long as they do not depart from the scope of the following claims. For instance, although the above embodiments are described using N-channel transistors, using P-channel enhancement MOS transistors can also be another option which provides the same functions and effects.

As it is clear from the above description, the semiconductor memory of the present invention is capable of detecting signal information for starting a predetermined test, inputting the detected output signals, controlling the operation delay time of the word line and the sense amplifier, and detecting the presence of memory cells having small operation margins of the data storage. By lowering the potential difference between the bit lines at a time of memory cell read-out, it is possible to easily and quickly find the memory cells with small margins as well as the sense amplifier.

While preferred embodiments of the invention have been described using specific terms, such description is for illustrative purposes only, and it is to be understood that changes and variations may be made without departing from the spirit or the scope of the following claims.

What is claimed is:

1. A semiconductor memory capable of detecting the presence of memory cells having small operation margins of data storage, within a short period of time, comprising:

at least two word lines;

at least two bit lines which are arranged in a manner crossing the word lines;

a reference potential generating circuit for generating a predetermined reference potential;

a reference potential transfering means for transfering the reference potential to the bit lines;

at least two memory cells arranged at intersections of the word lines and the bit lines;

a sense amplifier connected to the bit lines and amplifying potential difference between the bit lines, one of the bit lines receiving information of the memory cells, and the other one of the bit lines receiving the reference potential;

a test mode determination circuit for detecting signal information for starting a predetermined test; and a sense time control circuit taking an output signal from the test mode determination circuit as its input so as to control an operation delay time of the sense amplifier and the word lines.

2. A semiconductor memory according to claim 1, wherein;

a set of bit lines connected to the sense amplifier of the semiconductor memory indicates at least tow bit lines.

3. A semiconductor memory according to claim 1, wherein;

the signal information for starting the test is a signal for starting a test for detecting the presence of memory cells having small operation margins which are inputted from the outside of the semiconductor memory.

4. A semiconductor memory according to claim 2, wherein;

the signal information for starting the test is a signal for starting a test for detecting the presence of memory cells having small operation margins which are inputted from the outside of the semiconductor memory.

5. A semiconductor memory capable of detecting the presence of memory cells having small operation margins of data storage, within a short period of time, comprising:

at least two word lines;

at least two bit lines which are arranged in a manner crossing the word lines;

a reference potential generating circuit for generating a predetermined reference potential;

a reference potential transfering means for transfering the reference potential to the bit lines;

at least two memory cells arranged at intersections of the word lines and the bit lines;

a sense amplifier connected to the bit lines and amplifying potential difference between the bit lines, one of the bit lines receiving information of the memory cells, and the other one of the bit lines receiving the reference potential;

a test mode determination circuit for detecting signal information for starting a predetermined test; and a reference potential transforming means taking an output signal from the test mode determination circuit as its input so as to transform the reference voltage of the bit lines.

6. A semiconductor memory according to claim 5, wherein;

a set of bit lines connected to the sense amplifier of the semiconductor memory includes at least tow bit lines.

7. A semiconductor memory according to claim 5, wherein;

the signal information for starting the test is a signal for starting a test for detecting the presence of memory cells having small operation margins which are inputted from the outside of the semiconductor memory.

8. A semiconductor memory according to claim 6, wherein;

the signal information for starting the test is a signal for starting a test for detecting the presence of memory cells having small operation margins which are inputted from the outside of the semiconductor memory.

9. A semiconductor memory according to claim 5, wherein;

the reference potential transforming means includes a transformation signal generating means for transforming the reference voltage of the bit lines, the transformation signal generating means inputting the output signal from the test mode determination circuit for starting the test, and transforming the reference potential of the bit lines after an activation of a word line selecting signal.

10. A semiconductor memory according to claim 6, wherein;

the reference potential transforming means includes a transformation signal generating means for transforming the reference voltage of the bit lines, the transformation signal generating means inputting the output signal from the test mode determination circuit for starting the test, and transforming the reference potential of the bit lines after an activation of a word line selecting signal.

11. A semiconductor memory according to claim 7, wherein;

the reference potential transforming means includes a transformation signal generating means for transforming the reference voltage of the bit lines, the transformation signal generating means inputting the output signal from the test mode determination circuit for starting the test, and transforming the reference potential of the bit lines after an activation of a word line selecting signal.

* * * * *